United States Patent
Kim

(10) Patent No.: US 6,903,589 B2
(45) Date of Patent: Jun. 7, 2005

(54) OUTPUT DRIVER CIRCUIT WITH AUTOMATIC SLEW RATE CONTROL AND SLEW RATE CONTROL METHOD USING THE SAME

(75) Inventor: Chan-kyung Kim, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/752,500

(22) Filed: Jan. 8, 2004

(65) Prior Publication Data

US 2004/0140833 A1 Jul. 22, 2004

(30) Foreign Application Priority Data

Jan. 10, 2003 (KR) ................. 10-2003-0001592

(51) Int. Cl.[7] ................................ H03K 5/12
(52) U.S. Cl. ..................... 327/170; 327/108
(58) Field of Search .............. 327/108–112, 170, 327/172–175

(56) References Cited

U.S. PATENT DOCUMENTS 6,535,039 B2 * 3/2003 Nanba et al. ............... 327/170

* cited by examiner

Primary Examiner—Kenneth B. Wells
(74) Attorney, Agent, or Firm—Volentine Francos & Whitt, PLLC

(57) ABSTRACT

The output signal from an output driver is compared with first and second reference voltages. A first comparison output signal is generated which exhibits a voltage transition when the output signal reaches the first reference voltage, and a second comparison output signal is generated which exhibits a voltage transition when the output signal reaches the second reference voltage. First and second pulse widths values are then compared. The first pulse width value corresponds to a time delay difference between the voltage transition of the first comparison output signal and the voltage transition of the second comparison output signal, and the second pulse width value corresponds to a target slew rate of the output signal from the output driver. The slew rate of the output signal is decrease when the first pulse width value is smaller than the second pulse width value, and the slew rate of the output signal is increased when the first pulse width value is larger than the second pulse width value.

9 Claims, 1 Drawing Sheet

OUTPUT DRIVER CIRCUIT WITH AUTOMATIC SLEW RATE CONTROL AND SLEW RATE CONTROL METHOD USING THE SAME

BACKGROUND OF THE INVENTION

1. Field of the Invention

The present invention relates to a semiconductor device, and more particularly, the present invention relates to an output driver of a semiconductor device and to a method of controlling the slew rate thereof.

A claim of priority is made to Korean Patent Application No. 2003-1592 filed on Jan. 10, 2003, in the Korean Intellectual Property Office, the disclosure of which is incorporated herein in its entirety by reference.

2. Description of the Related Art

In a semiconductor device, an output driver is used to output signals externally from the device. The slew rate of an output signal from the output driver is a significant factor for devices operating at a high-frequency. This is because the slew rate must generally be increased for a high-frequency operation as compared to a low-frequency operation.

The slew rate of the output signal is typically adjusted using one of two methods. In a first method, a signal output from an output driver is measured and the slew rate of the signal is adjusted using a predetermined selection signal according to the result of measurement. In a second method, the slew rate of an output signal is adjusted according to the operation of a circuit that detects a process voltage temperature (PVT) which exhibits some correlation to slew rate.

However, the first method is disadvantageous because it is generally inconvenient to measure the slew rate of the output signal using conventional measurement techniques. The second method is also disadvantageous because the slew rate is not adjusted based an actually measured slew rate, and inaccuracies may therefore be introduced.

SUMMARY OF THE INVENTION

The present invention provides an output driver in which the slew rate of an output signal is automatically detected and is adjusted based on the detection result.

The present invention also provides a method of adjusting the slew rate of an output signal output from such an output driver.

According to an aspect of the present invention, there is provided a circuit for outputting a signal having a target slew rate. The circuit includes an output driver, a slew rate detection circuit, a pulse width comparison circuit, and a slew rate control circuit. The output driver outputs an output signal and is responsive to a slew rate control signal to increase or decrease a slew rate of the output signal. The slew rate detection circuit compares the output signal from the output driver with a first reference voltage and generates a first comparison output signal which exhibits a voltage transition when the output signal reaches the first reference voltage, and compares the output signal with a second reference voltage and generates a second comparison output signal which exhibits a voltage transition when the output signal reaches the second reference voltage. The pulse width comparison circuit compares a first pulse width value with a second pulse width value, the first pulse width value corresponding to a time delay difference between the voltage transition of the first comparison output and the voltage transition of the second comparison output signal, and the second pulse width value corresponding to a target slew rate of the output signal from the output driver. The slew rate control circuit generates the slew rate control signal in response to a signal output from the pulse width comparison circuit.

According to another aspect of the present invention, there is provided a method of controlling the slew rate of an output signal output from an output driver. The output signal from the output driver is compared with a first reference voltage and a first comparison output signal is generated which exhibits a voltage transition when the output signal reaches the first reference voltage. The output signal is compared with a second reference voltage and a second comparison output signal is generated which exhibits a voltage transition when the output signal reaches the second reference voltage. A first pulse width value is then compared with a second pulse width value. The first pulse width value corresponds to a time delay difference between the voltage transition of the first comparison output signal and the voltage transition of the second comparison output signal, and the second pulse width value corresponds to a target slew rate of the output signal from the output driver. The slew rate of the output signal is decreased when the first pulse width value is smaller than the second pulse width value, and the slew rate of the output signal is increased when the first pulse width value is larger than the second pulse width value.

BRIEF DESCRIPTION OF THE DRAWINGS

The above and other aspects and advantages of the present invention will become more apparent by describing in detail preferred embodiments thereof with reference to the attached drawings, in which.

DETAILED DESCRIPTION OF THE PREFERRED EMBODIMENTS

Figure 1:
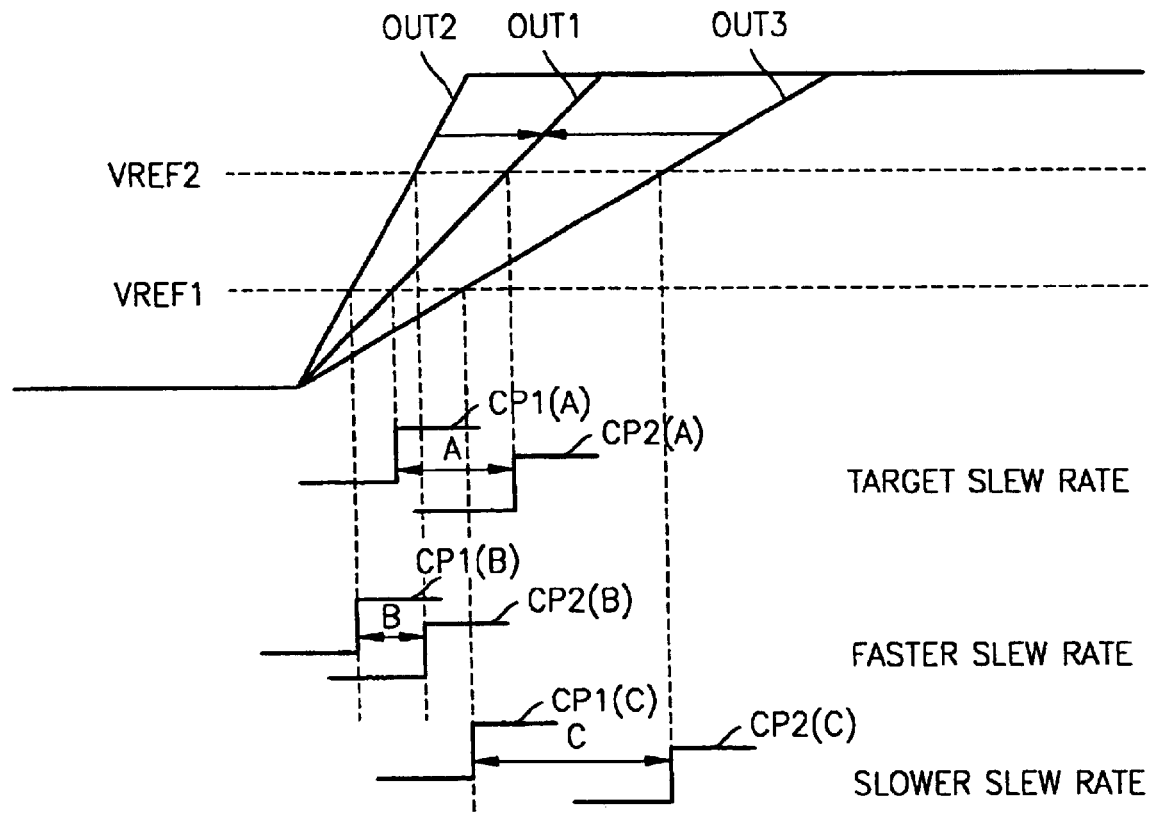
FIG. 1 shows a diagram illustrating basic principles of a method of controlling the slew rate of an output signal output from an output driver, according to a preferred embodiment of the present invention.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. The same reference numerals represent the same elements throughout the drawings.

FIG. 1 shows a diagram illustrating basic principles of a method of controlling the slew rate of an output signal output from an output driver according to a preferred embodiment of the present invention. In FIG. 1, OUT1 denotes a desired output signal having a target slew rate, OUT2 denotes an output signal having a slew rate that is greater than that of the desired output signal OUT1, and OUT3 denotes an output signal having a slew rate that is less than that of the desired output signal OUT1.

Hereinafter, a method of controlling the slew rate of a signal output from an output driver according to a preferred embodiment of the present invention will be described in detail with reference to FIG. 1. In this embodiment, the slew rate of an output signal is detected using two reference voltages, i.e., a first reference voltage VREF1 and a second reference voltage VREF2. Here, the level of the second reference voltage VREF2 is higher than that of the first reference voltage VREF1.

In this method, first, a target slew rate of an output signal is set from an external source. For example, when an output driver is included in a semiconductor memory device such as synchronous dynamic random access memory (DRAM), the target slew rate is set from external the semiconductor memory device during a mode register set (MRS) operation in the semiconductor memory device.

The target slew rate may be externally supplied in the form of a digital value indicative of a time delay difference A between a target signal CP1(A) and a target signal CP2(A) of the desired output signal OUT1 having the target slew rate. Here, the desired output signal OUT1 having a target slew rate is assumed to be an ideal signal. The target slew rate can be changed by externally adjusting the digital value.

After setting the target slew rate of the desired output signal, the slew rate of the actual output signal is monitored as to whether is greater than or less than the target slew rate.

That is, assume first that the signal OUT2 is actually output from the output driver, and accordingly, the actual slew rate of the output signal is greater than the target slew rate. The level of the actual output signal OUT2 is compared with that of the first reference voltage VREF1 so as to generate a comparison output signal CP1(B). As shown in FIG. 1, the signal CP1(B) exhibits a voltage transition when the signal OUT2 reaches VREF1. Next, the level of the actual output signal OUT2 is compared with that of the second reference voltage VREF2 so as to generate a comparison output signal CP2(B). Again, the signal CP2(B) exhibits a voltage transition when the signal OUT2 reaches VREF2. The time delay difference between the voltage transitions of signals CP1(B) and CP2(B) is denoted in FIG. 1 by reference B.

Now assume that the signal OUT3 is actually output from the output driver, and accordingly, the actual slew rate of the output driver is less than the target slew rate. The level of the actual output signal OUT3 is compared with that of the first reference voltage VREF1 so as to generate a comparison output signal CP1(C). As shown in FIG. 1, the signal CP1(C) exhibits a voltage transition when the signal OUT3 reaches VREF1. Next, the level of the actual output signal OUT3 is compared with that of the second reference voltage VREF2 so as to generate a comparison output signal CP2(C). Again, the signal CP2(C) exhibits a voltage transition when the signal OUT3 reaches VREF2. The time delay difference between the voltage transitions in signals CP1(C) and CP2 (C) is denoted in FIG. 1 by reference number C.

By comparing the time delay difference B or C with the target value A, a determination is made as to whether the actual slew rate of the output signal should be increased or decreased.

That is, if the time delay difference B is detected which is smaller than the time delay difference A, the slew rate of the actual output signal OUT2 is reduced in a direction towards the target slew rate of the desired output signal OUT1. On the other hand, if the time delay difference C is detected which is greater than the time delay difference A, the slew rate of the actual output signal OUT3 is increased in a direction towards the target slew rate of the desired output signal OUT 1. In this manner, by repeatedly increasing or decreasing the slew rate of the output signal based on the detected time delay difference, the actual slew rate of the output signal is brought into conformity with the target slew rate.

Figure 2:
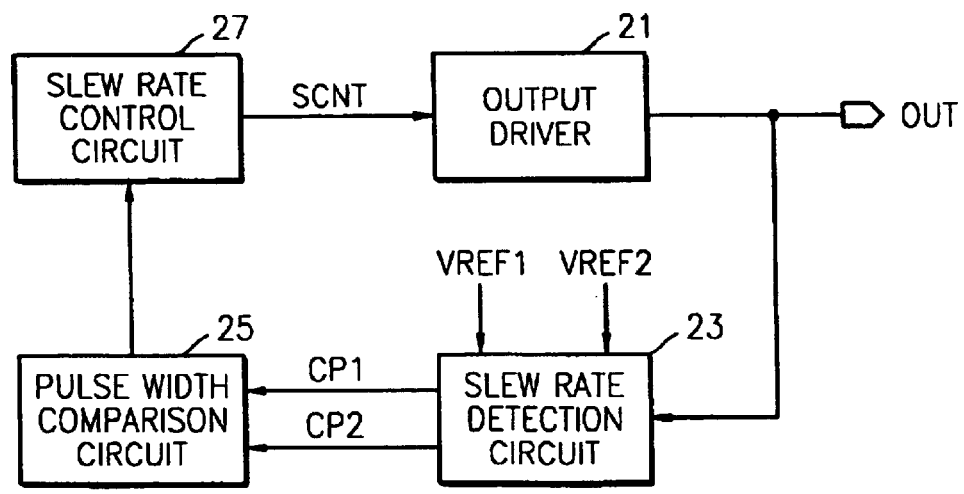
FIG. 2 is a block diagram illustrating the structure of an output driver circuit with automatic slew rate control, according to a preferred embodiment of the present invention.

FIG. 2 is a block diagram illustrating the structure of a circuit having an automatic slew rate control mechanism according to a preferred embodiment of the present invention. The circuit of FIG. 2 operates according to the method explained above in connection with FIG. 1

As shown, the circuit of FIG. 2 includes an output driver 21, a slew rate detection circuit 23, a pulse width comparison circuit 25, and a slew rate control circuit 27.

The slew rate detection circuit 23 compares an output signal OUT output from the output driver 21 with the first reference voltage VREF1 and outputs the result of the first comparison as a signal CP1. Also, the slew rate detection circuit 23 compares the output signal OUT with the second reference voltage VREF2 and outputs the result of comparison as a signal CP2. As previously mentioned, the level of the second reference voltage VREF2 is higher than that of the first reference voltage VREF1.

The pulse width comparison circuit 25 compares a first pulse width with a second pulse width. Here, the first pulse width corresponds to a time delay difference, i.e., a time delay difference B or C as shown in FIG. 1, between the rising edges (voltage transitions) of the first and second comparison output signals CP1 and CP2. The second pulse width corresponds to a target slew rate of the output signal OUT output from the output driver 21, i.e., a time delay difference A as shown in FIG. 1, between the first and second target comparison output signals CP1 and CP2.

As described above, the target slew rate is a digital value that is set from an external source. Therefore, the target slew rate can be changed by adjusting a digital value from external the semiconductor memory device. If the output driver is included in a semiconductor memory device such as synchronous DRAM, the target slew rate may be set external the semiconductor memory device during a mode register set (MRS) operation in the semiconductor memory device.

In response to a signal output from the pulse width comparison circuit 25, the slew rate control circuit 27 generates a control signal SCNT which is supplied to a control input of the output driver 21. The output driver 21 is responsive to the control signal SCNT to either increase or decrease the actual slew rate of the output signal.

More specifically, when the pulse width comparison circuit 25 compares the first (measured) pulse width with the second (target) pulse width and determines that the first pulse width is smaller than the second pulse width, the slew rate control circuit 27 sets a value of the control signal SCNT which causes the output driver 21 to decrease the slew rate of the output signal OUT. In contrast, when the first pulse width is larger than the second pulse width, the slew control circuit 27 sets a value of the control signal SCNT which causes the output driver 21 to increase the slew rate of the output signal OUT. In this way, the slew rate of the output signal OUT can be adjusted to the target slew rate.

As described above, an output driver with automatic slew rate control according to the present invention, and a slew rate control method according to the present invention, are advantageous in that the slew rate of an output signal is automatically detected in a semiconductor memory chip including the output driver, and thus, the slew rate can be adjusted based on the detection result.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A circuit for outputting a signal having a target slew rate, said circuit comprising:

an output driver that outputs an output signal and is responsive to a slew rate control signal to increase or decrease a slew rate of the output signal;

a slew rate detection circuit that compares the output signal from the output driver with a first reference voltage and generates a first comparison output signal which exhibits a voltage transition when the output signal reaches the first reference voltage, and compares the output signal with a second reference voltage and generates a second comparison output signal which exhibits a voltage transition when the output signal reaches the second reference voltage;

a pulse width comparison circuit that compares a first pulse width value with a second pulse width value, the first pulse width value corresponding to a time delay difference between the voltage transition of the first comparison output and the voltage transition of the second comparison output signal, and the second pulse width value corresponding to a target slew rate of the output signal from the output driver; and a slew rate control circuit that generates the slew rate control signal in response to a signal output from the pulse width comparison circuit.

2. The circuit of claim 1, wherein the level of the second reference voltage is higher than that of the first reference voltage.

3. The circuit of claim 1, wherein the slew rate control circuit generates a first slew rate control signal which causes the output driver to decrease the slew rate of the output signal when the signal output from the pulse width comparison circuit indicates that the first pulse width value is smaller than the second pulse width value, and generates a second slew rate control signal which causes the output driver to increase the slew rate of the output signal when the signal output from the pulse width comparison circuit indicates that the first pulse width value is greater than the second pulse width value.

4. The circuit of claim 1, wherein the output driver is included in a semiconductor memory device, and wherein the target slew rate is set from external the semiconductor memory device.

5. The circuit of claim 1, wherein the output driver is included in a semiconductor memory device, and wherein target slew rate is set from external the semiconductor device during a mode register set (MRS) operation.

6. A method of controlling the slew rate of an output signal output from an output driver, the method comprising:

comparing the output signal from the output driver with a first reference voltage and generating a first comparison output signal which exhibits a voltage transition when the output signal reaches the first reference voltage;

comparing the output signal with a second reference voltage and generating a second comparison output signal which exhibits a voltage transition when the output signal reaches the second reference voltage;

comparing a first pulse width value with a second pulse width value, the first pulse width value corresponding to a time delay difference between the voltage transition of the first comparison output signal and the voltage transition of the second comparison output signal, and the second pulse width value corresponding to a target slew rate of the output signal from the output driver; and decreasing the slew rate of the output signal when the first pulse width value is smaller than the second pulse width value, and increasing the slew rate of the output signal when the first pulse width value is larger than the second pulse width value.

7. The method of claim 6, wherein the level of the second reference voltage is higher than that of the first reference voltage.

8. The method of claim 6, wherein the output driver is included in a semiconductor memory device, and wherein the target slew rate is set from external the semiconductor memory device.

9. The method of claim 6, wherein the output driver is included in a semiconductor memory device, and wherein target slew rate is set from external the semiconductor device during a mode register set (MRS) operation.

* * * * *